(12) United States Patent
Takahashi

(10) Patent No.: US 11,496,106 B2
(45) Date of Patent: Nov. 8, 2022

(54) FILTER MODULE

(71) Applicant: Murata Manufacturing Co., Ltd., Kyoto (JP)

(72) Inventor: Kazuhiro Takahashi, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 2 days.

(21) Appl. No.: 16/890,062

(22) Filed: Jun. 2, 2020

(65) Prior Publication Data
US 2020/0389145 A1    Dec. 10, 2020

(30) Foreign Application Priority Data

Jun. 10, 2019  (JP) .............................. JP2019-107983

(51) Int. Cl.
| | | |
|---|---|---|
| H03H 7/01 | (2006.01) | |
| H01L 23/66 | (2006.01) | |
| H01L 23/552 | (2006.01) | |
| H03H 7/09 | (2006.01) | |
| H01F 38/14 | (2006.01) | |
| H03H 1/00 | (2006.01) | |

(52) U.S. Cl.
CPC ........... *H03H 7/0115* (2013.01); *H01F 38/14* (2013.01); *H01L 23/552* (2013.01); *H01L 23/66* (2013.01); *H03H 7/09* (2013.01); *H03H 7/1766* (2013.01); *H01F 2038/146* (2013.01); *H03H 2001/0085* (2013.01)

(58) Field of Classification Search
CPC . H03H 7/0115; H03H 2001/0085; H03H 7/09
USPC ................................................ 333/175, 185
See application file for complete search history.

(56) References Cited

U.S. PATENT DOCUMENTS

| | | | |
|---|---|---|---|
| 10,608,682 B2* | 3/2020 | Watanabe | ................ H04B 1/18 |
| 2012/0319801 A1 | 12/2012 | Taniguchi | |
| 2013/0120950 A1 | 5/2013 | Tomaki et al. | |
| 2016/0079952 A1 | 3/2016 | Kikuchi | |
| 2020/0243254 A1 | 7/2020 | Imamura | |

FOREIGN PATENT DOCUMENTS

| | | |
|---|---|---|
| JP | 2010-147791 A | 7/2010 |
| WO | 2011/114851 A1 | 9/2011 |
| WO | 2014/192431 A1 | 12/2014 |
| WO | 2019087739 A1 | 5/2019 |

* cited by examiner

*Primary Examiner* — Rakesh B Patel
(74) *Attorney, Agent, or Firm* — Pearne & Gordon LLP

(57) ABSTRACT

A filter device is mounted on a module substrate and is shielded by a shield member. The filter device has first and second side surfaces opposed to each other. A ground terminal and signal terminals are formed on a bottom surface of the filter device. The shield member includes side wall portions facing the first and second side surfaces. The filter device includes plural LC parallel resonance circuits therein. The inductors of the LC parallel resonance circuits are arranged in parallel with the first side surface and the bottom surface. Each inductor extends upward from its end portion electrically connected to the ground terminal, extends from the first side surface toward the second side surface, and then extends toward the bottom surface. The gap between the first side surface and the corresponding side wall portion is smaller than that between the second side surface and the corresponding side wall portion.

21 Claims, 13 Drawing Sheets

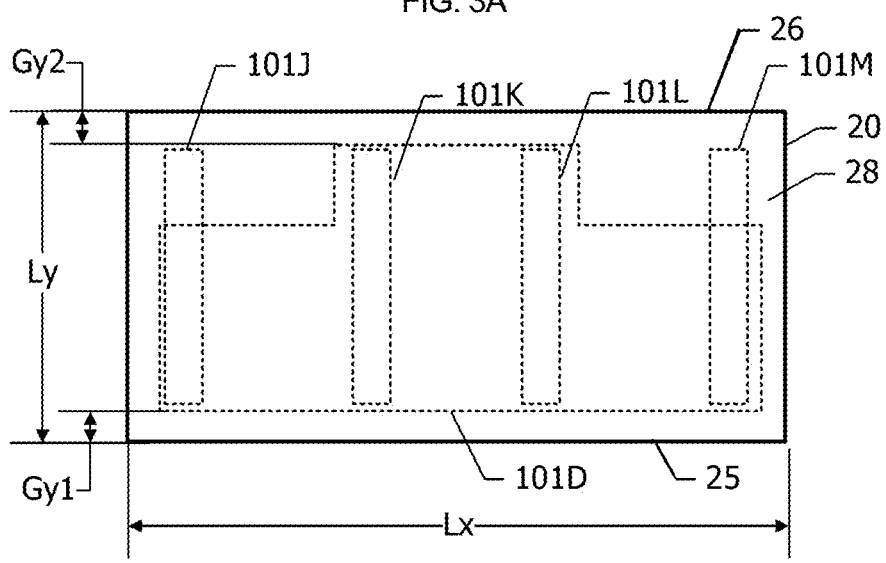
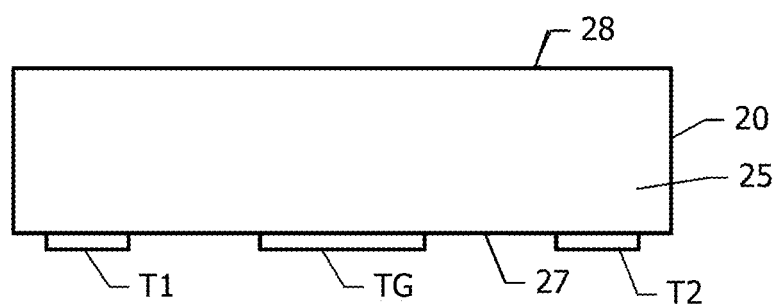
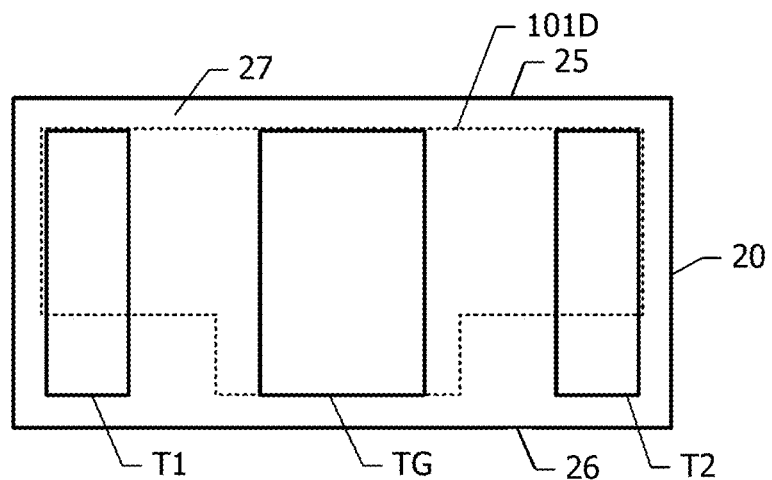

FILTER MODULE

This application claims priority from Japanese Patent Application No. 2019-107983 filed on Jun. 10, 2019. The content of this application is incorporated herein by reference in its entirety.

BACKGROUND OF THE DISCLOSURE

1. Field of the Disclosure

The present disclosure relates to a filter module.

2. Description of the Related Art

In the fifth generation mobile communication system (5G), Band n77 in the frequency band of 3.3 to 4.2 GHz, Band n78 in the frequency band of 3.3 to 3.8 GHz, and Band n79 in the frequency band of 4.4 to 5.0 GHz, for example, are defined. As a band pass filter used in these frequency bands, the use of a filter device including multiple parallel resonance circuits, each of which is constituted by an inductor and a capacitor, is being discussed (International Publication No. 2011/114851, for example). This filter device is implemented as the following multilayer radio-frequency filter. A predetermined conductive pattern is formed on each of plural insulating layers, and the conductive patterns formed on different insulating layers are connected to each other by via-conductors.

BRIEF SUMMARY OF THE DISCLOSURE

The filter device is mounted on a common module substrate, together with other circuit components, such as a radio-frequency switch and a low-noise amplifier. The circuit components mounted on the module substrate are electromagnetically shielded by a shield member. The inventor of this application has discovered that, when the filter device is mounted on the module substrate and is electromagnetically shielded by the shield member, the characteristics of the filter device may deviate from those of a filter device alone. This may fail to obtain target filter characteristics.

It is an object of the present disclosure to provide a filter module that can exhibit target filter characteristics in the state in which a filter device is mounted on a module substrate and is electromagnetically shielded by a shield member.

According to an aspect of the present disclosure, there is provided a filter module including a module substrate, a filter device, and a shield member. The filter device has a top surface and a bottom surface opposed to each other and first and second side surfaces opposed to each other. A ground terminal and first and second signal terminals are formed on the bottom surface. The filter device is mounted on the module substrate such that the bottom surface faces the module substrate. The shield member includes first and second side wall portions. The first and second side wall portions respectively face the first and second side surfaces so as to shield the filter device. The filter device includes plural parallel resonance circuits therein. Each of the plural parallel resonance circuits includes an inductor and a capacitor connected in parallel with each other. The inductors of the plural parallel resonance circuits are arranged in a direction parallel with the first side surface and the bottom surface. Each of the inductors of the plural parallel resonance circuits has a ground-side end portion and a signal-side end portion positioned at opposite sides. Each of the inductors extends upward from the ground-side end portion, which is electrically connected to the ground terminal, then extends in a direction from the first side surface toward the second side surface, and then extends in a direction toward the bottom surface. The signal-side end portion of the inductor of one of the plural parallel resonance circuits is electrically connected to the first signal terminal, while the signal-side end portion of the inductor of another one of the plural parallel resonance circuits is electrically connected to the second signal terminal. A gap between the first side surface and the first side wall portion is smaller than a gap between the second side surface and the second side wall portion.

According to another aspect of the present disclosure, there is provided a filter module including a module substrate, a filter device, and a shield member. The filter device has a top surface and a bottom surface opposed to each other and first and second side surfaces opposed to each other. A ground terminal and first and second signal terminals are formed on the bottom surface. The filter device is mounted on the module substrate such that the bottom surface faces the module substrate. The shield member includes first and second side wall portions. The first and second side wall portions respectively face the first and second side surfaces so as to shield the filter device. The filter device includes plural parallel resonance circuits therein. Each of the plural parallel resonance circuits includes an inductor and a capacitor connected in parallel with each other. The plural parallel resonance circuits are arranged in a direction parallel with the first side surface and the bottom surface. Each of the inductors of the plural parallel resonance circuits has a ground-side end portion and a signal-side end portion positioned at opposite sides. Each of the inductors extends upward from the ground-side end portion, which is electrically connected to the ground terminal, then extends in a direction from the first side surface toward the second side surface, and then extends in a direction toward the bottom surface. The signal-side end portion of the inductor of one of the plural parallel resonance circuits is electrically connected to the first signal terminal, while the signal-side end portion of the inductor of another one of the plural parallel resonance circuits is electrically connected to the second signal terminal. A gap between the second side surface and the second side wall portion is smaller than a gap between the first side surface and the first side wall portion, and is about 0.5 mm or larger.

As a result of arranging the positional relationship between the filter device and the shield member as described above, target filter characteristics can be obtained.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIGS. 3A, 3B, and 3C are respectively a plan view, a front view, and a bottom view of the filter device according to the first embodiment;

DETAILED DESCRIPTION OF THE DISCLOSURE

A filter module according to a first embodiment will be discussed below with reference to FIGS. 1 through 11B.

Figure 1:
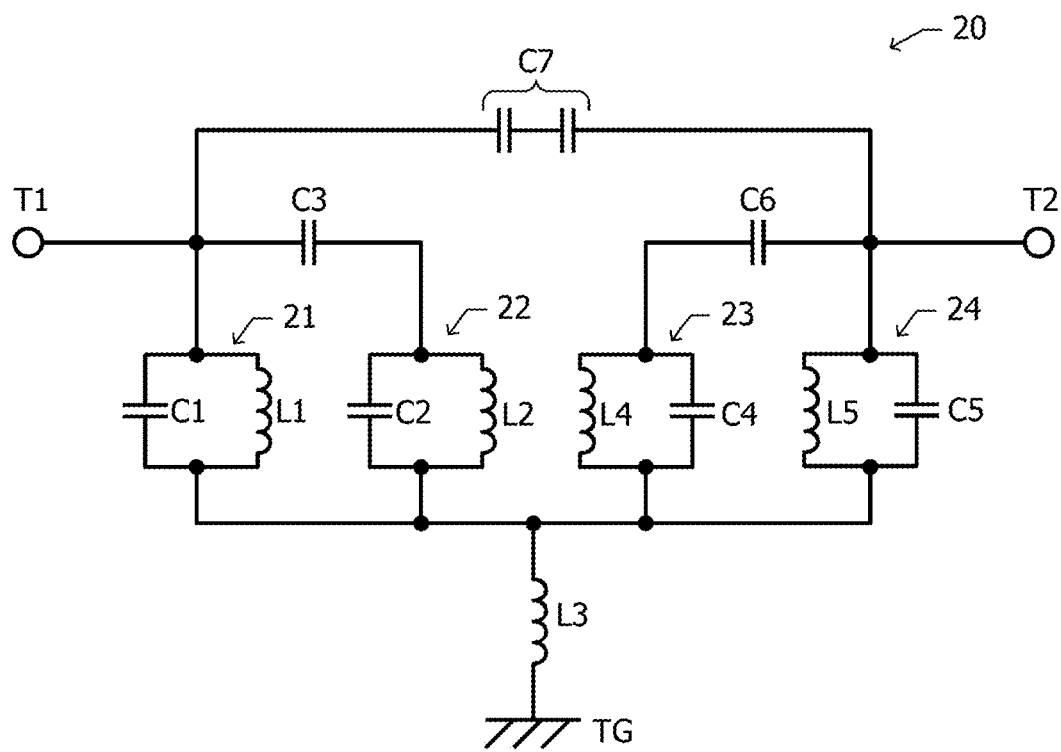
FIG. 1 is an equivalent circuit diagram of a filter device mounted on a filter module according to a first embodiment.

FIG. 1 is an equivalent circuit diagram of a filter device 20 mounted on the filter module according to the first embodiment. The filter device 20 includes first through fourth parallel resonance circuits 21, 22, 23, and 24. The first parallel resonance circuit 21 includes an inductor L1 and a capacitor C1 connected in parallel with each other. The second parallel resonance circuit 22 includes an inductor L2 and a capacitor C2 connected in parallel with each other. The third parallel resonance circuit 23 includes an inductor L4 and a capacitor C4 connected in parallel with each other. The fourth parallel resonance circuit 24 includes an inductor L5 and a capacitor C5 connected in parallel with each other. The filter device 20 is a band pass filter for the 5G Band n77 frequency band, for example.

One terminal of each of the four parallel resonance circuits 21 through 24 is connected to a ground terminal TG via a common inductor L3. The terminal connected to the ground terminal TG will be called a ground-side terminal. The other terminals of the four parallel resonance circuits 21 through 24 positioned opposite to the ground-side terminals are called signal-side terminals. The signal-side terminal of the first parallel resonance circuit 21 is connected to a first signal terminal T1. A capacitor C3 is connected between the signal-side terminal of the first parallel resonance circuit 21 and that of the second parallel resonance circuit 22. The signal-side terminal of the fourth parallel resonance circuit 24 is connected to a second signal terminal T2. A capacitor C6 is connected between the signal-side terminal of the third parallel resonance circuit 23 and that of the fourth parallel resonance circuit 24. Series-connected two capacitors C7 are connected between the first signal terminal T1 and the second signal terminal T2. The inductors L1, L2, L4, and L5 of the four parallel resonance circuits 21 through 24 are inductively coupled with each other.

Figure 2:
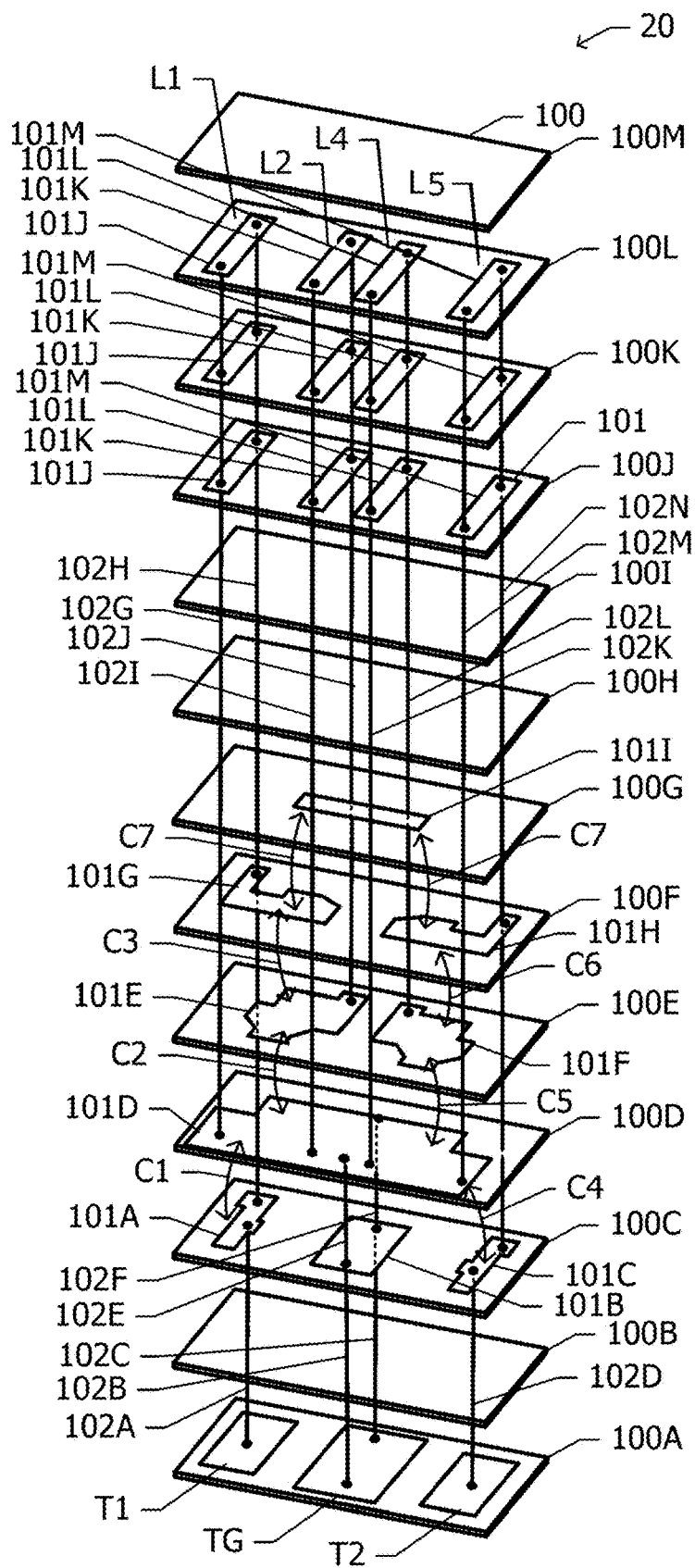
FIG. 2 is an exploded perspective view of the filter device according to the first embodiment.

FIG. 2 is an exploded perspective view of the filter device 20 according to the first embodiment. FIG. 3A is a plan view of the filter device 20. FIG. 3B is a front view of the filter device 20. FIG. 3C is a bottom view of the filter device 20.

The outer shape of the filter device 20 is a substantially rectangular parallelepiped. The shape of the filter device 20 as viewed from above is substantially rectangular, and the long sides are about twice as long as the short sides. The filter device 20 is surface-mounted on a module substrate, for example. It is assumed that the surface of the filter device 20 facing the module substrate is a bottom surface 27 and the surface opposed to the bottom surface 27 is a top surface 28. It is also assumed that two opposing side surfaces are first and second side surfaces 25 and 26. The first and second side surfaces 25 and 26 connect the long sides of the bottom surface 27 and those of the top surface 28. The direction from the bottom surface 27 to the top surface 28 is called a height direction.

Thirteen dielectric layers 100A, 100B, . . . , 100M are stacked on each other in this order from the bottom surface 27 in the height direction. When the plural dielectric layers 100A, 100B, . . . , 100M are not distinguished from each other, they are simply called the dielectric layers 100. Low-temperature co-fired ceramic (LTCC), for example, is used for the dielectric layers 100. Instead of an LTCC substrate, a glass substrate, a dielectric substrate made of an epoxy resin or a liquid crystal polymer may be used as the dielectric layers 100.

At least one conductive pattern is formed on each of some of the dielectric layers 100. Via-conductors are used for connecting the conductive patterns on different dielectric layers 100.

The first signal terminal T1, the ground terminal TG, and the second signal terminal T2 constituted by conductive patterns are formed on the outward surface (bottom surface 27) of the bottommost dielectric layer 100A. Three conductive patterns 101A, 101B, and 101C are formed on the third dielectric layer 100C. A ground conductor 101D constituted by a conductive pattern is formed on the fourth dielectric layer 100D. The conductive pattern 101A serves as one electrode of the capacitor C1, while the conductive pattern 101C serves as one electrode of the capacitor C4. The two conductive patterns 101A and 101C formed on the third dielectric layer 100C are opposed to the ground conductor 101D with the dielectric layer 100D interposed therebetween so as to form the capacitors C1 and C4, respectively.

The conductive pattern 101A serving as one electrode of the capacitor C1 is connected to the first signal terminal T1 by a via-conductor 102A. The conductive pattern 101C serving as one electrode of the capacitor C4 is connected to the second signal terminal T2 by a via-conductor 102D. The ground conductor 101D is connected to the ground terminal TG by via-conductors 102E and 102F, via the conductive pattern 101B disposed on the third dielectric layer 100C, and by via-conductors 102B, 102C. Parasitic inductance of the via-conductors 102B, 102C, 102E, and 102F is represented as the inductor L3 (FIG. 1).

Two conductive patterns 101E and 101F are formed on the fifth dielectric layer 100E. The conductive pattern 101E serves as one electrode of the capacitor C2, while the conductive pattern 101F serves as one electrode of the capacitor C5. The two conductive patterns 101E and 101F are opposed to the ground conductor 101D with the dielectric layer 100E interposed therebetween so as to form the capacitors C2 and C5, respectively.

Two conductive patterns 101G and 101H are formed on the sixth dielectric layer 100F. The two conductive patterns 101G and 101H respectively are opposed to the two conductive patterns 101E and 101F with the dielectric layer 100F interposed therebetween so as to form the capacitors C3 and C6.

One conductive pattern 101I is formed on the seventh dielectric layer 100G. The two conductive patterns 101G and 101H formed on the sixth dielectric layer 100F are opposed to the conductive pattern 101I with the dielectric layer 100G interposed therebetween so as to form the series-connected two capacitors C7.

Four conductive patterns 101J, 101K, 101L, and 101M are formed on the tenth dielectric layer 100J. Four conductive patterns 101J, 101K, 101L, and 101M having the same shape as those on the tenth dielectric layer 100J are also formed on each of the eleventh and twelfth dielectric layers 100K and 100L. The three conductive patterns 101J disposed on the three dielectric layers 100J, 100K, and 100L are overlaid on each other as viewed from above. Each set of the three conductive patterns 101K, the three conductive patterns 101L, and the three conductive patterns 101M is also formed in a similar manner.

A via-conductor 102G connects the vicinities of the end portions of the three conductive patterns 101J close to the first side surface 25 to the ground conductor 101D. A via-conductor 102H connects the vicinities of the end portions of the three conductive patterns 101J close to the second side surface 26 to the conductive pattern 101A. The via-conductor 102H is also connected to the conductive pattern 101G somewhere halfway. The via-conductor 102G, the conductive patterns 101J, and the via-conductor 102H form the inductor L1. That is, the inductor L1 extends upward from the end portion connected to the ground conductor 101D (this end portion will be called the ground-side end portion), then extends along the short side of the dielectric layers 100 from the first side surface 25 toward the second side surface 26, and then extends toward the bottom surface 27. The end portion (signal-side end portion) of the inductor L1 opposite to the ground-side end portion is connected to the conductive pattern 101A.

The inductor L2 is constituted by a via-conductor 102I, the conductive patterns 101K, and a via-conductor 102J. The via-conductor 102I extends upward from the ground conductor 101D. The conductive patterns 101K extend from the via-conductor 102I along the short side of the dielectric layers 100 from the first side surface 25 to the second side surface 26. The via-conductor 102J extends from the conductive patterns 101K toward the bottom surface 27. The inductor L4 is constituted by a via-conductor 102K, the conductive patterns 101L, and a via-conductor 102L. The via-conductor 102K extends upward from the ground conductor 101D. The conductive patterns 101L extend from the via-conductor 102K along the short side of the dielectric layers 100 from the first side surface 25 to the second side surface 26. The via-conductor 102L extends from the conductive patterns 101L toward the bottom surface 27. The inductor L5 is constituted by a via-conductor 102M, conductive patterns 101M, and a via-conductor 102N. The via-conductor 102M extends upward from the ground conductor 101D. The conductive patterns 101M extend from the via-conductor 102M along the short side of the dielectric layers 100 from the first side surface 25 to the second side surface 26. The via-conductor 102N extends from the conductive patterns 101M toward the bottom surface 27.

The inductors L1, L2, L4, and L5 are disposed in a direction parallel with both the first side surface 25 and the bottom surface 27, that is, along the long sides of the dielectric layers 100. The direction in which the inductors L1, L2, L4, and L5 are arranged will be called the arrangement direction of the inductors L1 through L5. The via-conductors 102G, 102I, 102K, and 102M of the inductors L1, L2, L4, and L5 connected to the ground conductor 101D are disposed closer to the first side surface 25 than the other via-conductors 102H, 102J, 102L, and 102N.

In one example, the dimension Lx (FIG. 3A) along the long sides of the filter device 20 is about 1.6 mm, and the dimension Ly (FIG. 3A) along the short sides of the filter device 20 is about 0.8 mm. The gap Gy1 (FIG. 3A) between the first side surface 25 and the ground conductor 101D is about 0.075 mm. The gap Gy2 (FIG. 3A) between the second side surface 26 and the ground conductor 101D is also about 0.075 mm.

Figure 4:
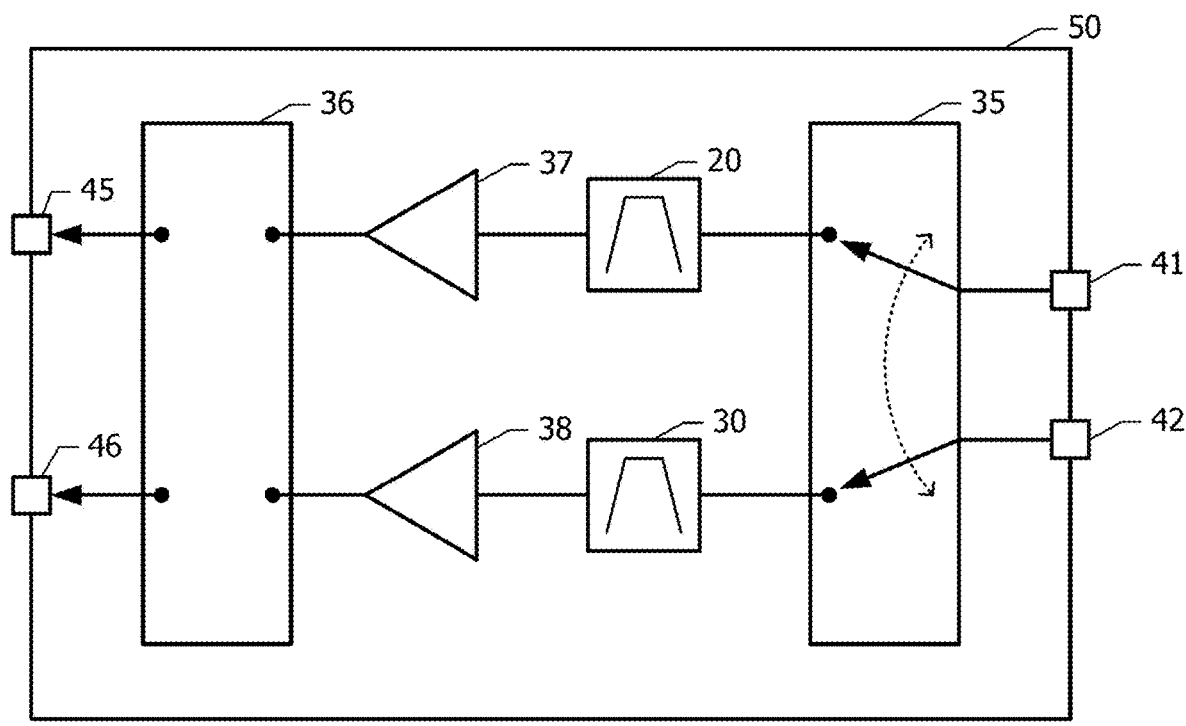
FIG. 4 is a block diagram of the filter module according to the first embodiment.

FIG. 4 is a block diagram of a filter module 50 according to the first embodiment. The filter module 50 includes two antenna terminals 41 and 42 and two output terminals 45 and 46. The two antenna terminals 41 and 42 are respectively connected to two filter devices 20 and 30 via a radio-frequency switch 35. The filter device 20 is a band pass filter that allows signals of the 5G Band n77 frequency band to pass therethrough. The filter device 30 is a band pass filter that allows signals of the 5G Band n79 frequency band to pass therethrough.

Signals passing through the filter devices 20 and 30 are respectively inputted into low-noise amplifiers 37 and 38. The signals amplified in the low-noise amplifiers 37 and 38 are respectively inputted into the output terminals 45 and 46 via a radio-frequency switch 36 and are outputted therefrom to the outside.

Figure 5A:
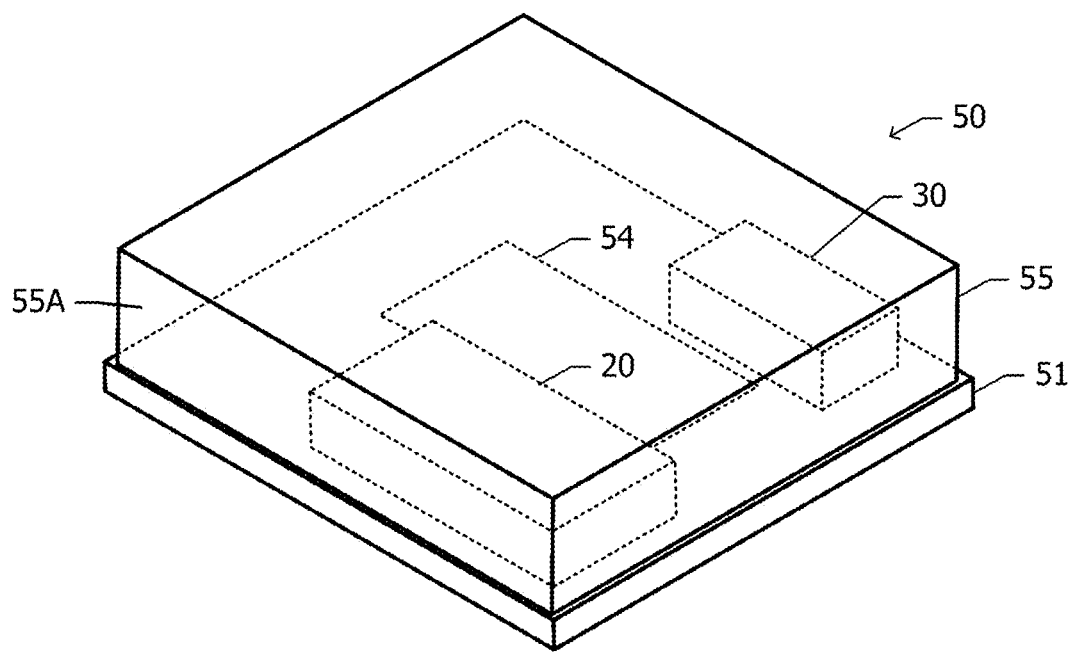
FIGS. 5A and 5B are respectively a perspective view and a sectional view of the filter module according to the first embodiment.
Figure 5B:
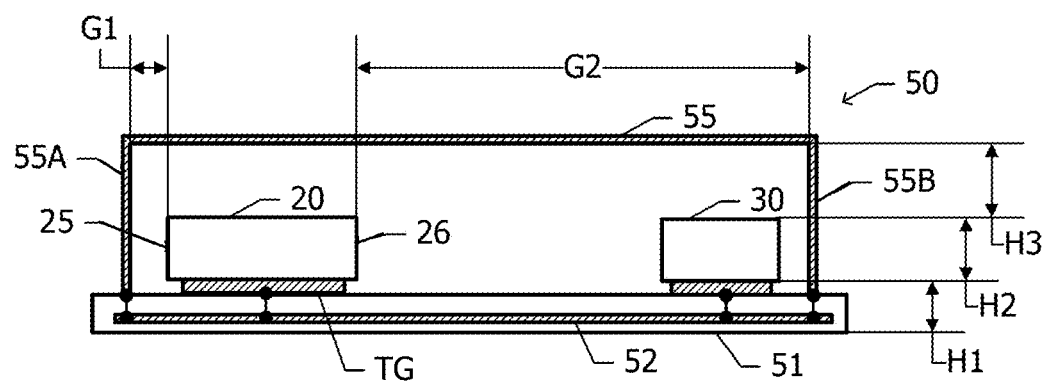

FIGS. 5A and 5B are respectively a perspective view and a sectional view of the filter module 50. The filter devices 20 and 30 are surface-mounted on the mounting surface of a module substrate 51. A region 54 where the low-noise amplifiers 37 and 38 (FIG. 4) and other elements are mounted is reserved on the mounting surface of the module substrate 51.

The module substrate 51 includes a ground plane 52 therein. The ground terminal TG of the filter device 20 is electrically connected to the ground plane 52. Likewise, the ground terminal of the filter device 30 is also electrically connected to the ground plane 52. A shield member 55 shields the filter devices 20 and 30, the low-noise amplifiers 37 and 38 (FIG. 4), and other elements mounted on the module substrate 51. The shield member 55 is electrically connected to the ground plane 52. The shield member 55 and the ground plane 52 electromagnetically shield the circuit components mounted on the module substrate 51.

The shield member 55 is formed of a conductive film, such as a metal film, which covers the surface of a resin that seals multiple circuit components mounted on the module substrate 51. The shield member 55 includes four side wall portions raised upward from the mounting surface of the module substrate 51 and a flat portion parallel with the module substrate 51. The filter device 20 is mounted on the module substrate 51 such that the first side surface 25 faces one side wall portion of the shield member 55. The side wall portion facing the first side surface 25 of the filter device 20 will be called a first side wall portion 55A. The side wall portion located opposite to the first side wall portion 55A will be called a second side wall portion 55B. The second side wall portion 55B faces the second side surface 26 of the filter device 20 with the filter device 30 and other circuit components interposed therebetween.

A gap G1 between the first side surface 25 of the filter device 20 and the first side wall portion 55A of the shield member 55 is smaller than a gap G2 between the second side surface 26 and the second side wall portion 55B.

In one example, the height H1 from the bottom surface of the module substrate 51 to the bottom surface of the filter device 20 is about 0.12 mm. The height H2 of the filter device 20 is about 0.325 mm. The height H3 from the top surface of the filter device 20 to the flat portion of the shield member 55 is about 0.305 mm.

Before describing advantages of the first embodiment, the issue to be handled when the filter device 20 is mounted on the module substrate 51 and is electromagnetically shielded by the shield member 55 will be discussed below with reference to FIG. 6.

Figure 6:
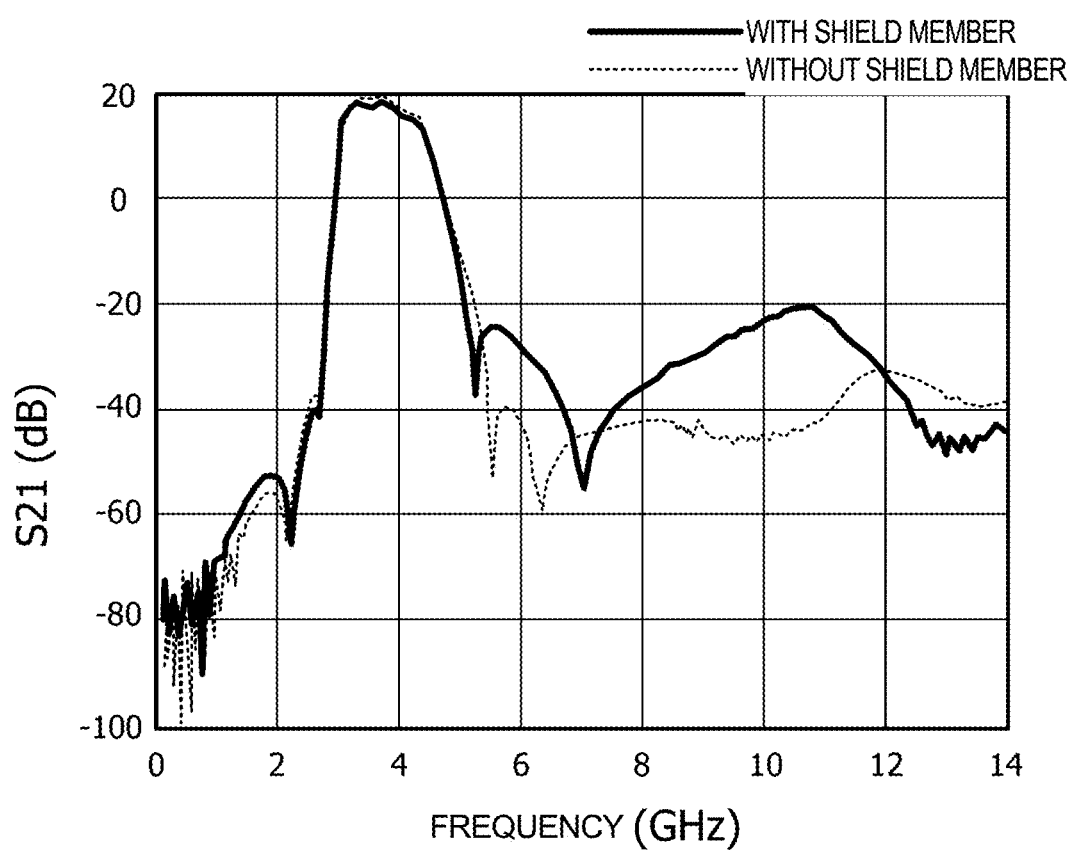
FIG. 6 is a graph illustrating the results of measuring the transmission coefficient S21 of a circuit constituted by the filter device and a low-noise amplifier.

FIG. 6 is a graph illustrating the results of measuring the transmission coefficient S21 of a circuit constituted by the filter device 20 and the low-noise amplifier 37 (FIG. 4). The horizontal axis indicates the frequency expressed by GHz, and the vertical axis indicates the transmission coefficient S21 expressed by dB. The broken line in FIG. 6 indicates the transmission coefficient S21 of the circuit without the shield member 55. The solid line in FIG. 6 indicates the transmission coefficient S21 of the circuit with the shield member 55.

In both the cases indicated by the broken line and the solid line, the transmission coefficient S21 becomes high in the frequency band of about 3.2 to 4.2 GHz, which is the frequency band of 5G Band n77. In the frequency band of about 5 to 7 GHz, which is higher than the pass band, two attenuation poles where the transmission coefficient S21 exhibits the local minimum values are observed. It is found that, when the shield member 55 is attached to the circuit, the positions of these two attenuation poles of the transmission coefficient S21 are shifted. The example in FIG. 6 shows that the distance between the two attenuation poles is increased and the transmission coefficient S21 in the frequency band between the two attenuation poles is higher compared with that in the circuit without the shield member 55. That is, the attenuation characteristics in the attenuation band outside the pass band are degraded for the circuit with the shield member 55.

The reason why the attenuation poles of the transmission coefficient S21 are shifted when the shield member 55 is attached may be explained as follows. When the shield member 55 is attached, multiple inductors within the filter device 20 are coupled with each other due to mutual induction via the shield member 55. This changes the circuit constants of the resonance circuits. The shifting amount of the attenuation poles is different depending on the positional relationship between the inductors and the shield member 55.

Simulations are conducted with an electromagnetic simulator to observe how the attenuation poles of the transmission coefficient S21 are changed when the positional relationship between the filter device 20 and the shield member 55 is varied. The simulation results will be discussed below with reference to FIGS. 7A through 8B.

Figure 7A:
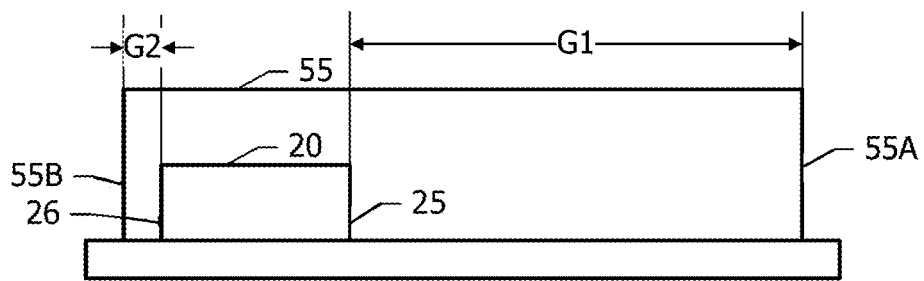
FIG. 7A is a schematic diagram illustrating the positional relationship between the filter device and a shield member.

FIG. 7A is a schematic diagram illustrating the positional relationship between the filter device 20 and the shield member 55. In the example in FIG. 7A, the gap G2 between the second side surface 26 of the filter device 20 and the second side wall portion 55B of the shield member 55 is smaller than the gap G1 between the first side surface 25 and the first side wall portion 55A. This configuration is realized as a result of rotating the filter device 20 shown in FIGS. 5A and 5B by 180 degrees in a plan view. In this configuration, the side wall portion closer to the filter device 20 is the second side wall portion 55B, while the side wall portion closer to the filter device 30 is the first side wall portion 55A.

Figure 7B:
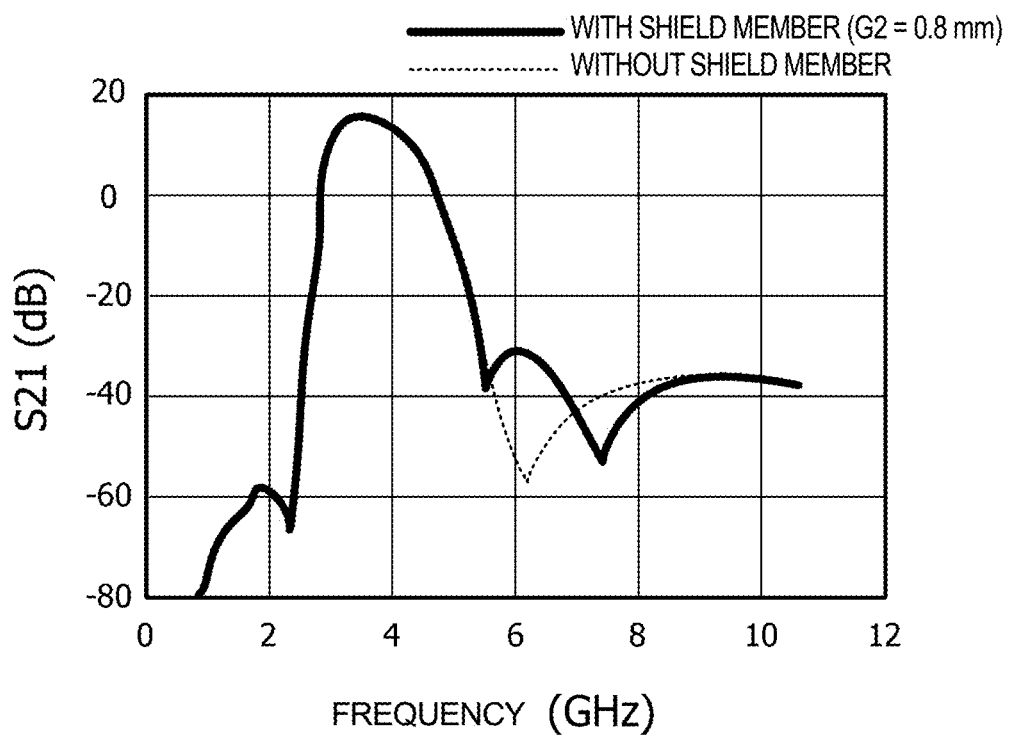
FIG. 7B is a graph illustrating the simulation results of the transmission coefficient S21 of the circuit constituted by the filter device and the low-noise amplifier.

FIG. 7B is a graph illustrating the simulation results of the transmission coefficient S21 of the circuit constituted by the filter device 20 and the low-noise amplifier 37 (FIG. 4). The horizontal axis indicates the frequency expressed by GHz, and the vertical axis indicates the transmission coefficient S21 expressed by dB. The broken line in FIG. 7B indicates the transmission coefficient S21 of the circuit without the shield member 55. The solid line in FIG. 7B indicates the transmission coefficient S21 of the circuit with the shield member 55 when the filter device 20 and the shield member 55 are arranged to have a gap G2 of about 0.8 mm.

In the circuit without the shield member 55, one attenuation pole is observed. In the circuit with the shield member 55, two attenuation poles are observed. One of the two attenuation poles is located on the higher frequency side than the attenuation pole for the circuit without the shield member 55, while the other attenuation pole is located on the lower frequency side than the attenuation pole for the circuit without the shield member 55.

Figure 8A:
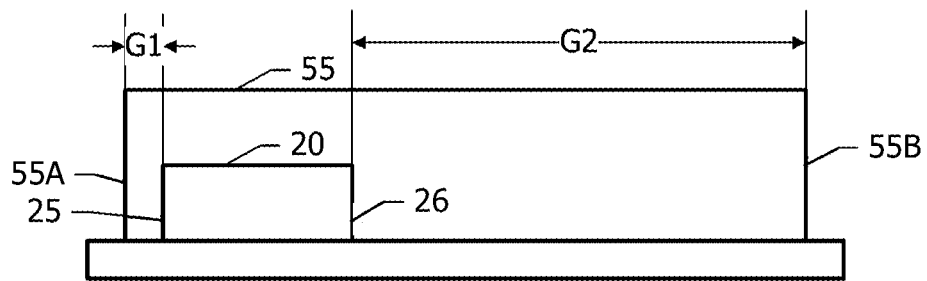
FIG. 8A is a schematic diagram illustrating the positional relationship between the filter device and the shield member.

FIG. 8A is a schematic diagram illustrating the positional relationship between the filter device 20 and the shield member 55. In the example in FIG. 8A, the gap G1 between the first side surface 25 of the filter device 20 and the first side wall portion 55A of the shield member 55 is smaller than the gap G2 between the second side surface 26 and the second side wall portion 55B.

Figure 8B:
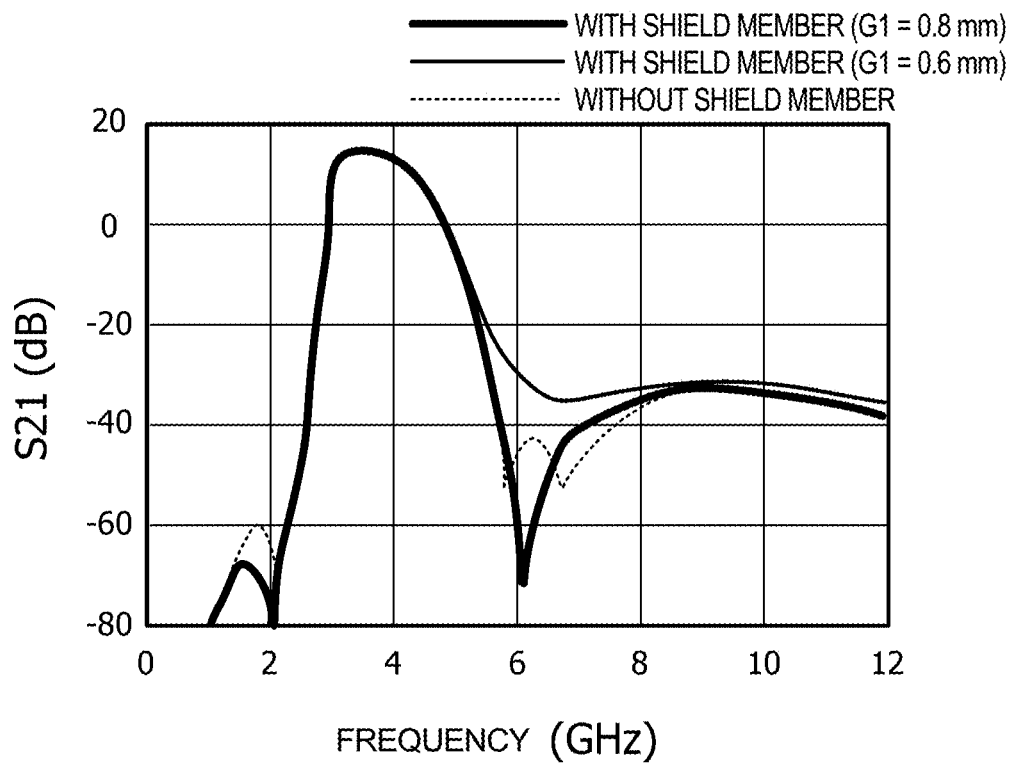
FIG. 8B is a graph illustrating the simulation results of the transmission coefficient S21 of the circuit constituted by the filter device and the low-noise amplifier.

FIG. 8B is a graph illustrating the simulation results of the transmission coefficient S21 of the circuit constituted by the filter device 20 and the low-noise amplifier 37 (FIG. 4). The horizontal axis indicates the frequency expressed by GHz, and the vertical axis indicates the transmission coefficient S21 expressed by dB. The broken line in FIG. 8B indicates the transmission coefficient S21 of the circuit without the shield member 55. The thin solid line in FIG. 8B indicates the transmission coefficient S21 of the circuit with the shield member 55 when the filter device 20 and the shield member 55 are arranged to have a gap G1 of about 0.6 mm. The thick solid line in FIG. 8B indicates the transmission coefficient S21 of the circuit with the shield member 55 when the filter device 20 and the shield member 55 are arranged to have a gap G1 of about 0.8 mm.

In the circuit without the shield member 55, two attenuation poles are observed. In the circuit with the shield member 55 having a gap G1 of about 0.6 mm, the attenuation poles have disappeared and the transmission coefficient S21 in the frequency band of about 6 to 7 GHz is increased. In the circuit with the shield member 55 having a gap G1 of about 0.8 mm, only one attenuation pole is observed, and the transmission coefficient S21 in the frequency band of about 6 GHz drops.

The simulation results shown in FIG. 7A through 8B show that the transmission coefficient S21 in the frequency band of about 6 to 7 GHz considerably varies depending on the positional relationship between the shield member 55 and the filter device 20.

An explanation will be given, with reference to FIGS. 9A through 10B, of the reason why the transmission coefficient S21 varies depending on the positional relationship between the shield member 55 and the filter device 20.

Figure 9A:
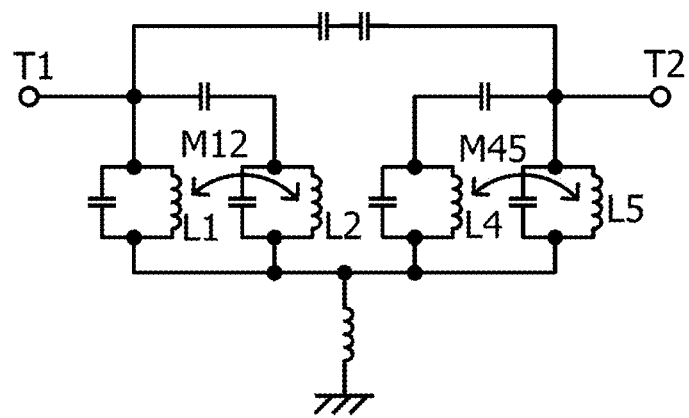
FIG. 9A is an equivalent circuit diagram of the filter device.
Figure 9B:
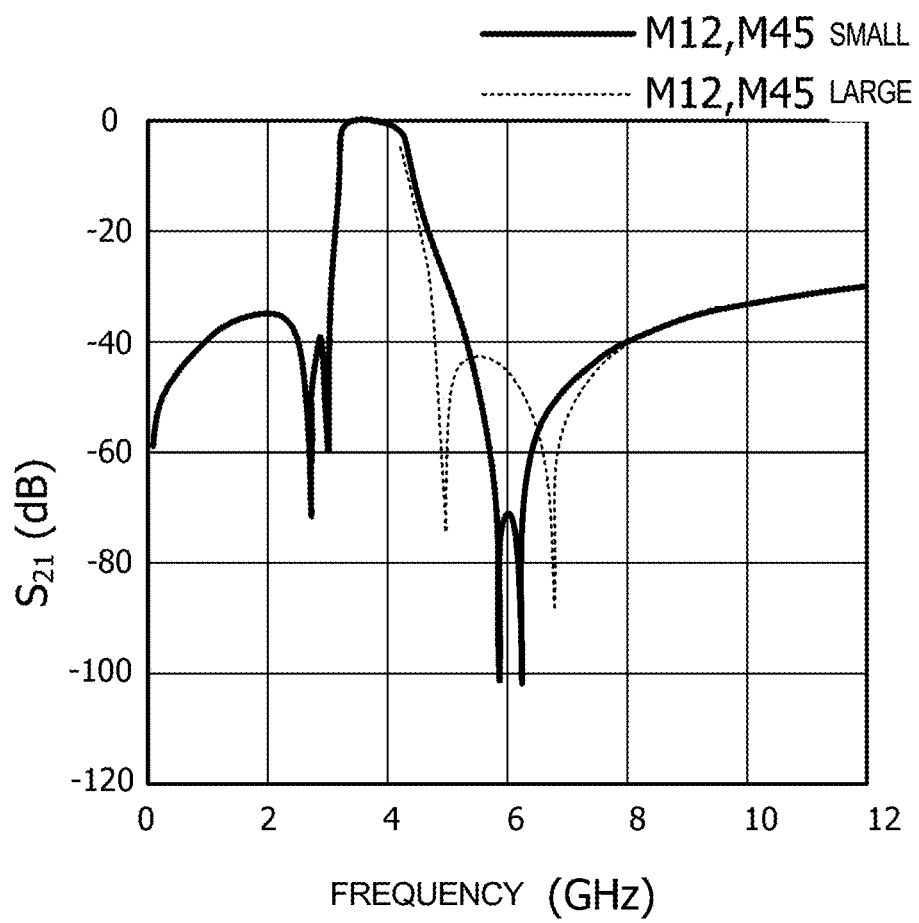
FIG. 9B is a graph illustrating the calculation results of the transmission coefficient S21 in the path from a first signal terminal to a second signal terminal in the equivalent circuit diagram in FIG. 9A.

FIG. 9A is an equivalent circuit diagram of the filter device 20. FIG. 9B is a graph illustrating the calculation results of the transmission coefficient S21 in the path from the first signal terminal T1 to the second signal terminal T2 in the equivalent circuit diagram in FIG. 9A. It is assumed that mutual inductance M12 between the inductors L1 and L2 and mutual inductance M45 between the inductors L4 and L5 will be changed depending on the positional relationship between the shield member 55 and the filter device 20. The transmission coefficient S21 when the mutual inductance M12 and the mutual inductance M45 are relatively small and that when the mutual inductance M12 and the mutual inductance M45 are relatively large are calculated.

In FIG. 9B, the horizontal axis indicates the frequency expressed by GHz, and the vertical axis indicates the transmission coefficient S21 expressed by dB. The solid line in FIG. 9B indicates the calculation result when the mutual inductance M12 and the mutual inductance M45 are relatively small. The broken line in FIG. 9B indicates the calculation result when the mutual inductance M12 and the mutual inductance M45 are relatively large.

FIG. 9B shows that, when the mutual inductance M12 and the mutual inductance M45 are large, the distance between the two attenuation poles is increased. This is similar to the case in which the attenuation poles of the transmission coefficient S21 are shifted when the shield member 55 is attached to the circuit, as shown in FIG. 7B. It may thus be assumed that the shield member 55 disposed near the second side surface 26 of the filter device 20 functions to increase the mutual inductance M12 and the mutual inductance M45.

Figure 10A:
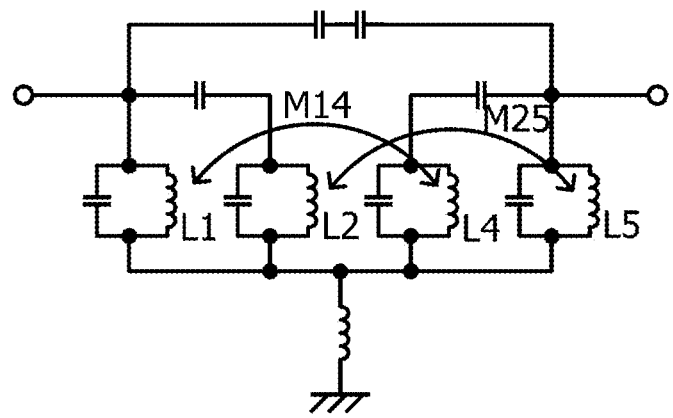
FIG. 10A is an equivalent circuit diagram of the filter device.
Figure 10B:
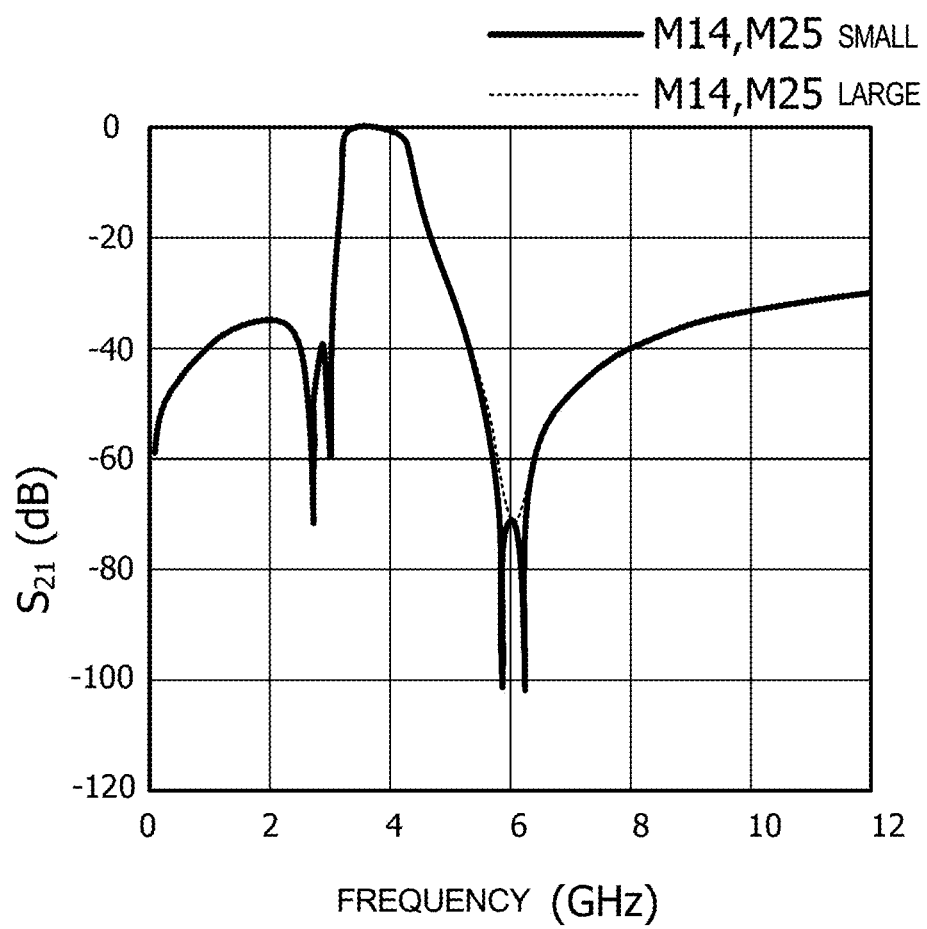
FIG. 10B is a graph illustrating the calculation results of the transmission coefficient S21 in the path from the first signal terminal to the second signal terminal in the equivalent circuit diagram in FIG. 10A.

FIG. 10A is an equivalent circuit diagram of the filter device 20. FIG. 10B is a graph illustrating the calculation results of the transmission coefficient S21 in the path from the first signal terminal T1 to the second signal terminal T2 in the equivalent circuit diagram in FIG. 10A. It is assumed that mutual inductance M14 between the inductors L1 and L4 and mutual inductance M25 between the inductors L2 and L5 will be changed depending on the positional relationship between the filter device 20 and the shield member 55. The transmission coefficient S21 when the mutual inductance M14 and the mutual inductance M25 are relatively small and that when the mutual inductance M14 and the mutual inductance M25 are relatively large are calculated.

In FIG. 10B, the horizontal axis indicates the frequency expressed by GHz, and the vertical axis indicates the transmission coefficient S21 expressed by dB. The solid line in FIG. 10B indicates the calculation result when the mutual inductance M14 and the mutual inductance M25 are relatively small. The broken line in FIG. 10B indicates the calculation result when the mutual inductance M14 and the mutual inductance M25 are relatively large.

FIG. 10B shows that, when the mutual inductance M14 and the mutual inductance M25 are large, the two attenuation poles have disappeared. The disappearance of the attenuation poles in this configuration is similar to that of the transmission coefficient S21 for the circuit with the shield member 55 having a gap G1 of about 0.6 mm indicated by the thin solid line in FIG. 8B. It may thus be assumed that the shield member 55 disposed near the first side surface 25 of the filter device 20 functions to increase the mutual inductance M14 and the mutual inductance M25.

Simulations are conducted with an electromagnetic simulator to observe the transmission coefficient S21 of the filter device 20 when the gap G1 (FIG. 5B) is varied. The simulation results will be discussed below with reference to FIGS. 11A and 11B. In the simulations, the gap G1 is set to be smaller than the gap G2 (FIG. 5B), and the gap G1 is varied, while the gap G2 is fixed. The pass band of the filter device 20 is about 3.3 to 4.2 GHz, which corresponds to G5 Band n77.

Figure 11A:
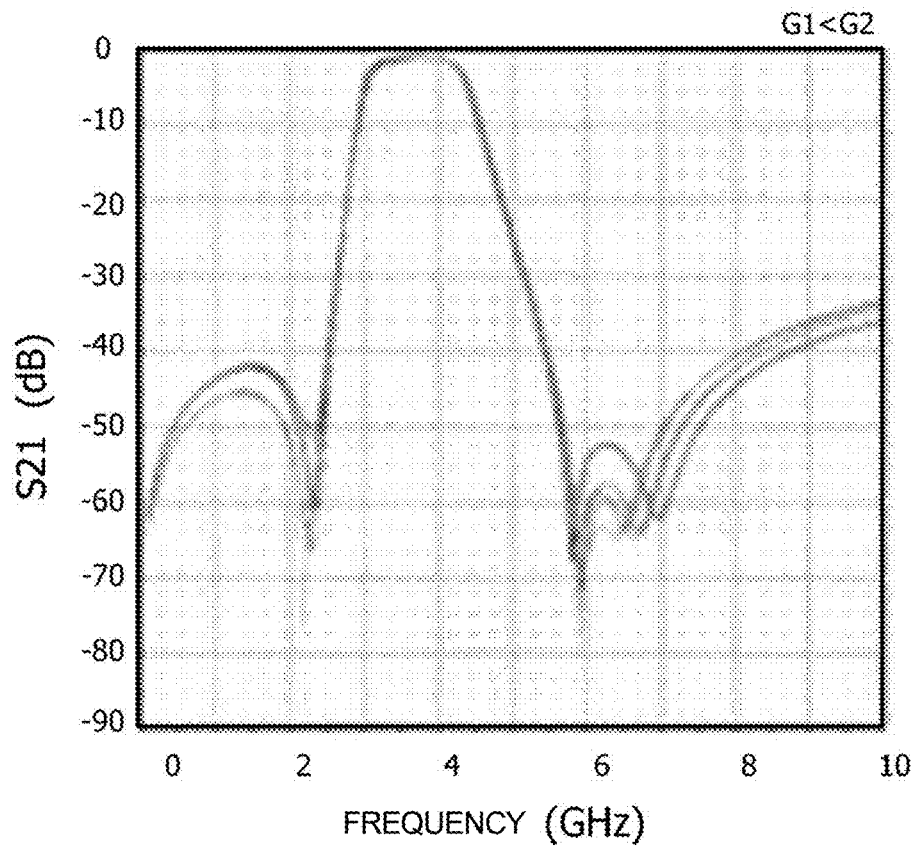
FIGS. 11A and 11B are graphs illustrating the simulation results obtained by using an electromagnetic simulator regarding the transmission coefficient S21 in the path from the first signal terminal to the second signal terminal of the filter device.
Figure 11B:
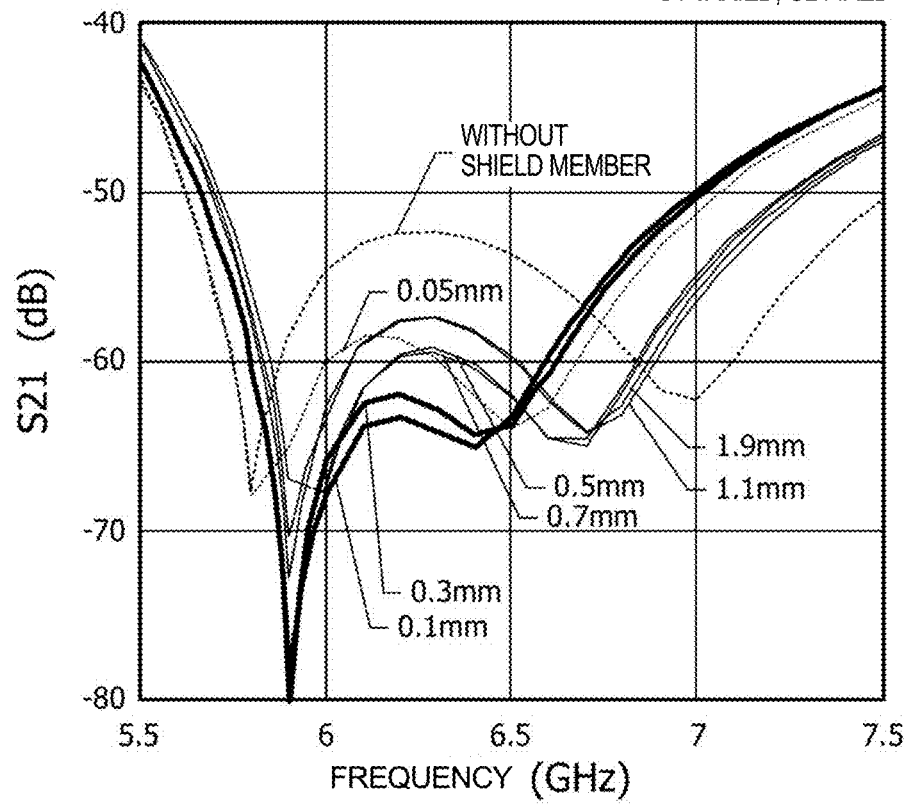

FIGS. 11A and 11B are graphs illustrating the simulation results of the transmission coefficient S21 in the path from the first signal terminal T1 to the second signal terminal T2 (FIGS. 1 and 2) of the filter device 20. The horizontal axis indicates the frequency expressed by GHz, and the vertical axis indicates the transmission coefficient S21 expressed by dB. FIG. 11B is an enlarged graph illustrating the frequency range of about 5.5 to 7.5 GHz of the graph in FIG. 11A.

The dimensions of the gap G1 are indicated near the individual lines in FIG. 11B. The two attenuation poles are observed in each line in FIG. 11B. When the shield member 55 is arranged such that the gap G1 is smaller than the gap G2, the attenuation pole of the higher frequency side is shifted to the lower frequency range from about 7 GHz at which the attenuation pole is located when the shield member 55 is not disposed. The attenuation pole of the lower frequency side is slightly shifted to the higher frequency range but does not exceed 6 GHz. The transmission coefficient S21 is decreased in the frequency range of about 6 to 6.5 GHz compared with that without the shield member 55. In particular, when the gap G1 is about 0.1 to 0.3 mm, the transmission coefficient S21 is reduced to about −60 dB or lower in the frequency range of about 6 to 6.5 GHz.

Advantages of the first embodiment will be described below.

In the first embodiment, as a result of arranging the filter device 20 and the shield member 55 such that the gap G1 is smaller than the gap G2 (FIG. 5B), the attenuation characteristics in the frequency band of about 6 to 6.5 GHz are considerably improved, in other words, the attenuation is considerably increased, compared with when the shield member 55 is not provided. Especially in the frequency band of 6 to 6.5 GHz, harmonic waves of a lower frequency band are likely to be superposed on a signal in the frequency band of 6 to 6.5 GHz as noise. The filter module 50 of the first embodiment can effectively be used particularly in the environments where high noise is likely to occur in the frequency band of about 6 to 6.5 GHz. With the configuration of the first embodiment, it is possible to obtain a high-performance filter device 20 having a pass band of the 5G Band n77 frequency band and having an attenuation band in the range of about 6 to 6.5 GHz.

To make the gap G1 to be narrower than the gap G2, it is preferable that no circuit components be mounted between the first side surface 25 of the filter device 20 and the opposing first side wall portion 55A of the shield member 55. The circuit components, such as the filter device 30 (FIG. 5A) and the low-noise amplifiers 37 and 38 (FIG. 4), are disposed between the second side surface 26 and the opposing second side wall portion 55B of the shield member 55.

The gap Gy1 (FIG. 3A) between the first side surface 25 of the filter device 20 and the ground conductor 101D is about 0.075 mm. When the gap G1 is about 0.1 to 0.3 mm, the gap between the first side wall portion 55A and the ground conductor 101D is about 0.175 to 0.375 mm. From the viewpoint of the ground conductor 101D of the filter device 20, it is preferable that the gap between the first side wall portion 55A and the ground conductor 101D be about 0.175 to 0.375 mm.

A modified example of the first embodiment will be described below.

The filter device 20 of the filter module 50 according to the first embodiment includes the four parallel resonance circuits 21, 22, 23, and 24. However, the filter device 20 may include any multiple number of parallel resonance circuits.

Second Embodiment

A filter module 50 according to a second embodiment will be described below with reference to FIGS. 12, 13A, and 13B. The same configuration as that of the filter module 50 of the first embodiment will not be explained.

Figure 12:
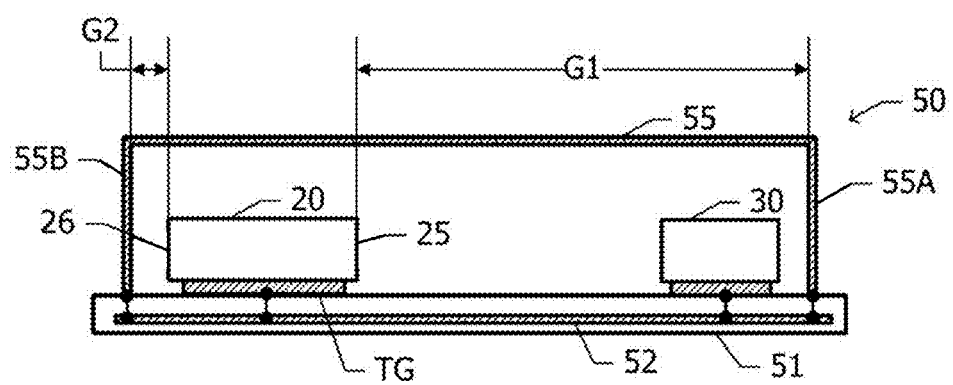
FIG. 12 is a sectional view of a filter module according to a second embodiment.
Figure 13A:
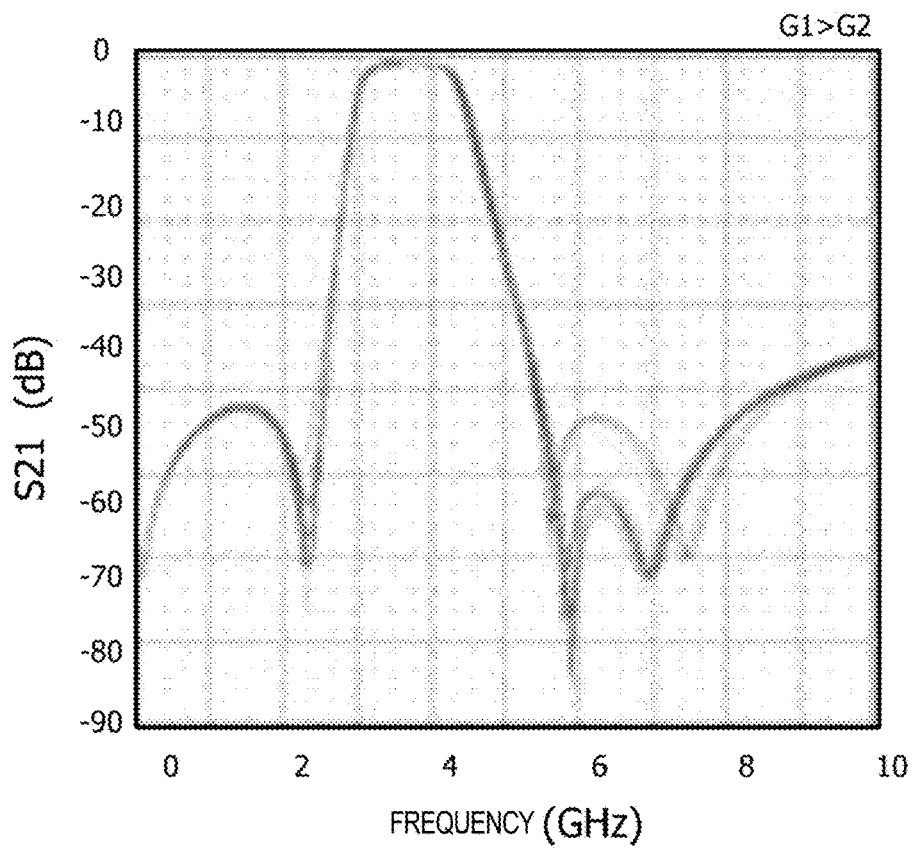
FIGS. 13A and 13B are graphs illustrating the simulation results obtained by using an electromagnetic simulator regarding the transmission coefficient S21 in the path from a first signal terminal to a second signal terminal of a filter device according to the second embodiment.
Figure 13B:
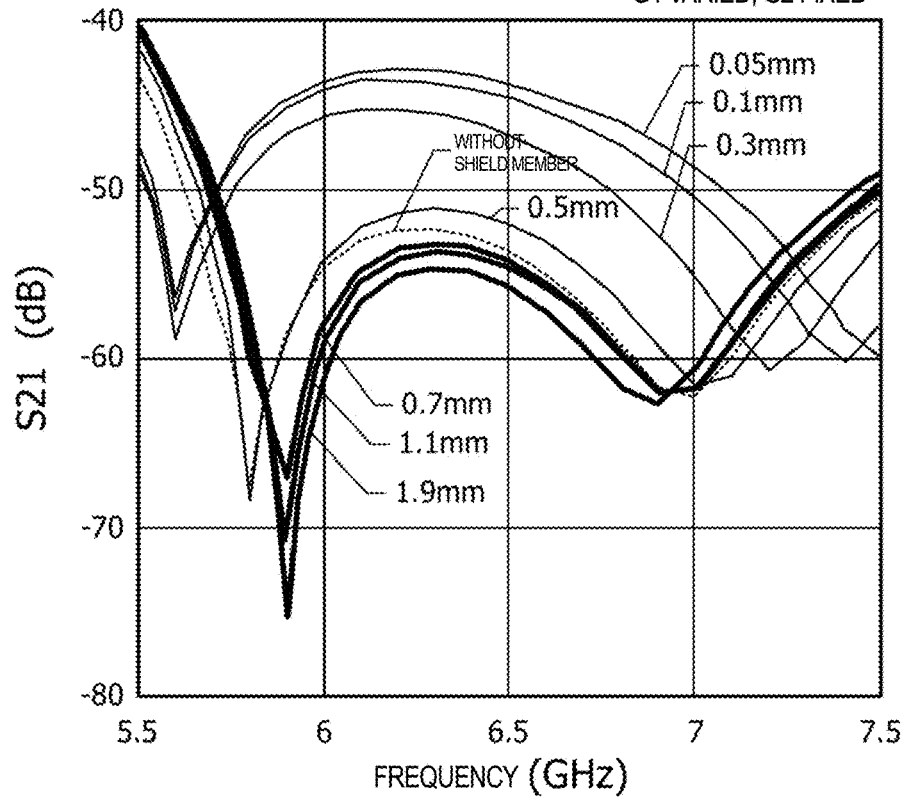

FIG. 12 is a sectional view of the filter module 50 according to the second embodiment. In the first embodiment, the gap G1 is set to be smaller than the gap G2, as shown in FIG. 5B. In the second embodiment, the gap G2 is set to be smaller than the gap G1. In other words, the second side surface 26 of the filter device 20 is disposed close to the second side wall portion 55B of the shield member 55, and no circuit components are mounted therebetween.

Simulations are conducted with an electromagnetic simulator to observe the transmission coefficient S21 in the path from the first signal terminal T1 to the second signal terminal T2 (FIGS. 1 and 2) of the filter device 20. FIGS. 13A and 13B are graphs illustrating the simulation results. The horizontal axis indicates the frequency expressed by GHz, and the vertical axis indicates the transmission coefficient S21 expressed by dB. FIG. 13B is an enlarged graph illustrating the frequency range of about 5.5 to 7.5 GHz of the graph in FIG. 13A.

When the gap G2 is smaller than about 0.5 mm, the attenuation pole of the lower frequency side is shifted to the lower frequency range and the attenuation pole of the higher frequency side is shifted to the higher frequency range from those of the transmission coefficient S21 when the shield member 55 is not provided. The reason for this may be that the mutual inductance M12 between the inductors L1 and L2 and the mutual inductance M45 between the inductors L4 and L5 are increased by the provision of the shield member 55, as shown in FIGS. 9A and 9B.

When the gap G2 is about 0.5 mm or larger, the provision of the shield member 55 does not significantly change the transmission coefficient S21 from that when the shield member 55 is not provided. That is, the transmission coefficient S21 is not considerably influenced by the shield member 55. It is thus preferable to set the gap G2 between the second side surface 26 of the filter device 20 and the second side wall portion 55B of the shield member 55 to be about 0.5 mm or larger.

Advantages of the second embodiment will be described below.

In the second embodiment, as a result of arranging the filter device 20 and the shield member 55 such that the gap G2 is smaller than the gap G1 and that the gap G2 is about 0.5 mm or larger, the transmission coefficient S21 of the filter device 20 is less influenced by the provision of the shield member 55. The gap Gy1 (FIG. 3A) between the first side surface 25 of the filter device 20 and the ground conductor 101D is about 0.075 mm. When the gap G2 is about 0.5 mm or larger, the gap between the second side wall portion 55B and the ground conductor 101D is about 0.575 mm or larger. From the viewpoint of the ground conductor 101D of the filter device 20, it is preferable that the gap between the second side wall portion 55B and the ground conductor 101D be about 0.575 mm or larger.

The disclosure is not limited to the above-described embodiments. The configurations described in the different embodiments may partially be replaced by or combined with each other. Similar advantages obtained by similar configurations in plural embodiments are not repeated in the individual embodiments.

While preferred embodiments of the disclosure have been described above, it is to be understood that variations, improvements, combinations, and modifications will be apparent to those skilled in the art without departing from the scope and spirit of the disclosure. The scope of the disclosure, therefore, is to be determined solely by the following claims.

What is claimed is:

1. A filter module comprising:
   a module substrate;
   a filter device having a top surface and a bottom surface opposed to each other and first and second side surfaces opposed to each other, a ground terminal and first and second signal terminals being provided on the bottom surface, the filter device being mounted on the module substrate such that the bottom surface faces the module substrate; and
   a shield member including first and second side wall portions, the first and second side wall portions respectively facing the first and second side surfaces so as to shield the filter device, wherein
   the filter device includes a plurality of parallel resonance circuits, each of the plurality of parallel resonance circuits including an inductor and a capacitor connected in parallel with each other,
   the inductors of the plurality of parallel resonance circuits are arranged in a direction parallel with the first side surface and the bottom surface,
   each of the inductors of the plurality of parallel resonance circuits has a ground-side end portion and a signal-side end portion positioned at opposite sides, and each of the inductors extends upward from the ground-side end portion electrically connected to the ground terminal, then extends in a direction from the first side surface toward the second side surface, and then extends in a direction toward the bottom surface,
   the signal-side end portion of the inductor of one of the plurality of parallel resonance circuits is electrically connected to the first signal terminal, while the signal-side end portion of the inductor of another one of the plurality of parallel resonance circuits is electrically connected to the second signal terminal, and
   a gap between the first side surface and the first side wall portion is smaller than a gap between the second side surface and the second side wall portion.

2. The filter module according to claim 1, wherein the gap between the first side surface and the first side wall portion is about 0.1 to 0.3 mm.

3. The filter module according to claim 2, wherein:
   the filter device includes a ground conductor disposed in parallel with the bottom surface; and
   the ground-side end portion of each of the inductors of the plurality of parallel resonance circuits is connected to the ground conductor.

4. The filter module according to claim 2, wherein:
   the plurality of parallel resonance circuits are at least three parallel resonance circuits;
   the signal-side end portion of the inductor of the parallel resonance circuit disposed at one end of an arrangement direction of the plurality of parallel resonance circuits is electrically connected to the first signal terminal, while the signal-side end portion of the inductor of the parallel resonance circuit disposed at the other end of the arrangement direction is electrically connected to the second signal terminal; and the inductors of two parallel resonance circuits adjacent to each other are inductively coupled with each other.

5. The filter module according to claim 2, wherein:
the module substrate includes a ground plane; and
the shield member and the ground terminal are electrically connected to the ground plane.

6. The filter module according to claim 2, wherein the filter device is a band pass filter having a pass band including a frequency range of about 3.3 to 4.2 GHz and an attenuation band including a frequency range of about 6 to 6.5 GHz.

7. The filter module according to claim 1, wherein the filter device is a band pass filter having a pass band including a frequency range of about 3.3 to 4.2 GHz and an attenuation band including a frequency range of about 6 to 6.5 GHz.

8. The filter module according to claim 1, wherein the first and second signal terminals are not provided on any side surfaces including the first and second side surfaces.

9. The filter module according to claim 1, wherein:
the filter device includes a ground conductor disposed in parallel with the bottom surface; and
the ground-side end portion of each of the inductors of the plurality of parallel resonance circuits is connected to the ground conductor.

10. The filter module according to claim 9, wherein:
the module substrate includes a ground plane; and
the shield member and the ground terminal are electrically connected to the ground plane.

11. The filter module according to claim 9, wherein:
the plurality of parallel resonance circuits are at least three parallel resonance circuits;
the signal-side end portion of the inductor of the parallel resonance circuit disposed at one end of an arrangement direction of the plurality of parallel resonance circuits is electrically connected to the first signal terminal, while the signal-side end portion of the inductor of the parallel resonance circuit disposed at the other end of the arrangement direction is electrically connected to the second signal terminal; and
the inductors of two parallel resonance circuits adjacent to each other are inductively coupled with each other.

12. The filter module according to claim 9, wherein the filter device is a band pass filter having a pass band including a frequency range of about 3.3 to 4.2 GHz and an attenuation band including a frequency range of about 6 to 6.5 GHz.

13. The filter module according to claim 1, wherein:
the module substrate includes a ground plane; and
the shield member and the ground terminal are electrically connected to the ground plane.

14. The filter module according to claim 1, wherein:
the plurality of parallel resonance circuits are at least three parallel resonance circuits;
the signal-side end portion of the inductor of the parallel resonance circuit disposed at one end of an arrangement direction of the plurality of parallel resonance circuits is electrically connected to the first signal terminal, while the signal-side end portion of the inductor of the parallel resonance circuit disposed at the other end of the arrangement direction is electrically connected to the second signal terminal; and
the inductors of two parallel resonance circuits adjacent to each other are inductively coupled with each other.

15. The filter module according to claim 14, wherein the filter device is a band pass filter having a pass band including a frequency range of about 3.3 to 4.2 GHz and an attenuation band including a frequency range of about 6 to 6.5 GHz.

16. The filter module according to claim 14, wherein:
the module substrate includes a ground plane; and
the shield member and the ground terminal are electrically connected to the ground plane.

17. A filter module comprising:
a module substrate;
a filter device having a top surface and a bottom surface opposed to each other and first and second side surfaces opposed to each other, a ground terminal and first and second signal terminals being provided on the bottom surface, the filter device being mounted on the module substrate such that the bottom surface faces the module substrate; and
a shield member including first and second side wall portions, the first and second side wall portions respectively facing the first and second side surfaces so as to shield the filter device, wherein
the filter device includes a plurality of parallel resonance circuits, each of the plurality of parallel resonance circuits including an inductor and a capacitor connected in parallel with each other,
the plurality of parallel resonance circuits are arranged in a direction parallel with the first side surface and the bottom surface,
each of the inductors of the plurality of parallel resonance circuits has a ground-side end portion and a signal-side end portion positioned at opposite sides, and each of the inductors extends upward from the ground-side end portion electrically connected to the ground terminal, then extends in a direction from the first side surface toward the second side surface, and then extends in a direction toward the bottom surface,
the signal-side end portion of the inductor of one of the plurality of parallel resonance circuits is electrically connected to the first signal terminal, while the signal-side end portion of the inductor of another one of the plurality of parallel resonance circuits is electrically connected to the second signal terminal, and
a gap between the second side surface and the second side wall portion is smaller than a gap between the first side surface and the first side wall portion, and is about 0.5 mm or larger.

18. The filter module according to claim 17, wherein the filter device is a band pass filter having a pass band including a frequency range of about 3.3 to 4.2 GHz and an attenuation band including a frequency range of about 6 to 6.5 GHz.

19. The filter module according to claim 17, wherein:
the filter device includes a ground conductor disposed in parallel with the bottom surface; and
the ground-side end portion of each of the inductors of the plurality of parallel resonance circuits is connected to the ground conductor.

20. The filter module according to claim 17, wherein:
the plurality of parallel resonance circuits are at least three parallel resonance circuits;
the signal-side end portion of the inductor of the parallel resonance circuit disposed at one end of an arrangement direction of the plurality of parallel resonance circuits is electrically connected to the first signal terminal, while the signal-side end portion of the inductor of the parallel resonance circuit disposed at the other end of the arrangement direction is electrically connected to the second signal terminal; and the inductors of two parallel resonance circuits adjacent to each other are inductively coupled with each other.

21. The filter module according to claim 17, wherein:
the module substrate includes a ground plane; and
the shield member and the ground terminal are electrically connected to the ground plane.

* * * * *